United States Patent [19]

Pelino

[11] 4,278,979
[45] Jul. 14, 1981

[54] METHOD AND APPARATUS FOR TESTING SURVIVAL RADIOS

[75] Inventor: William M. Pelino, Hollywood, Fla.

[73] Assignee: ACR Electronics, Inc., Hollywood, Fla.

[21] Appl. No.: 80,498

[22] Filed: Oct. 1, 1979

[51] Int. Cl.³ ............................................. G01R 1/00
[52] U.S. Cl. .................................. 343/703; 343/18 A
[58] Field of Search ............... 343/703, 18 A, 22, 17.7

[56] References Cited

U.S. PATENT DOCUMENTS

| | | | |
|---|---|---|---|
| 3,182,262 | 5/1965 | Schumann | 343/703 |
| 3,906,403 | 9/1975 | Czerwinski | 343/703 |

Primary Examiner—David K. Moore
Attorney, Agent, or Firm—Darby & Darby

[57] ABSTRACT

A test apparatus is disclosed which is particularly adapted for testing survival-type radio transmitters in the field. The apparatus includes an enclosed metallic test chamber into which the antenna of the radio transmitter is placed. A movable load carriage within the chamber applies a load to a predetermined point on the antenna which results in simulating in the test chamber the radio frequency absorption/reflection characteristics of the antenna in free space. A direct measurement of the radio frequency energy absorbed by the load is thus indicative of the performance of the radio transmitter and its antenna in free space.

15 Claims, 7 Drawing Figures

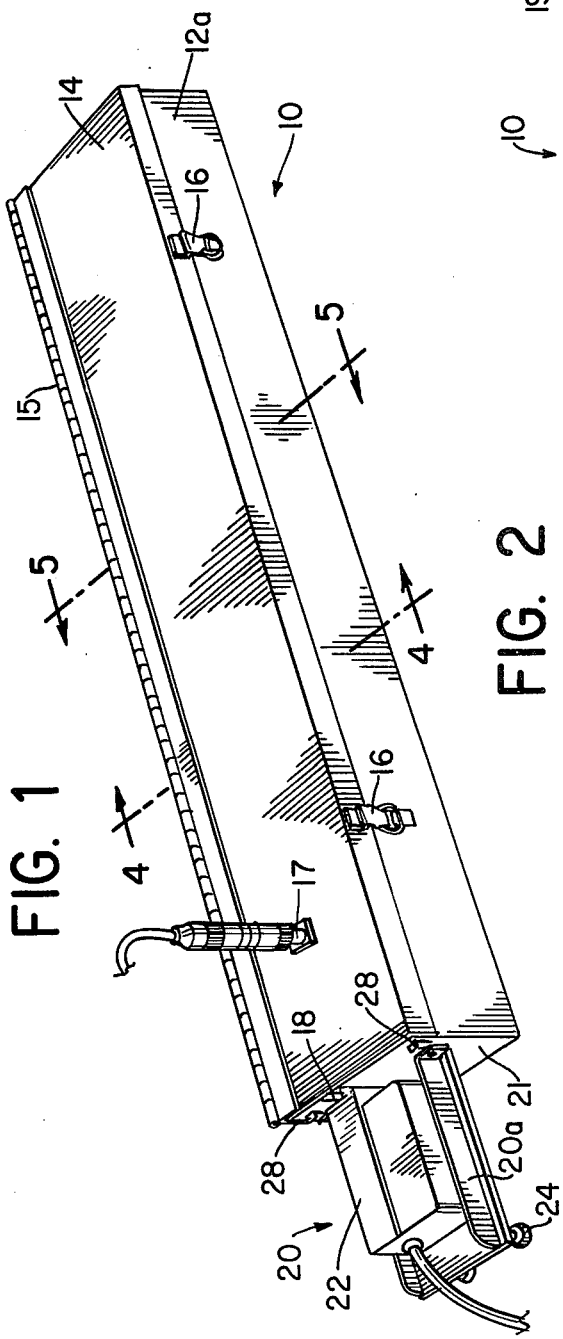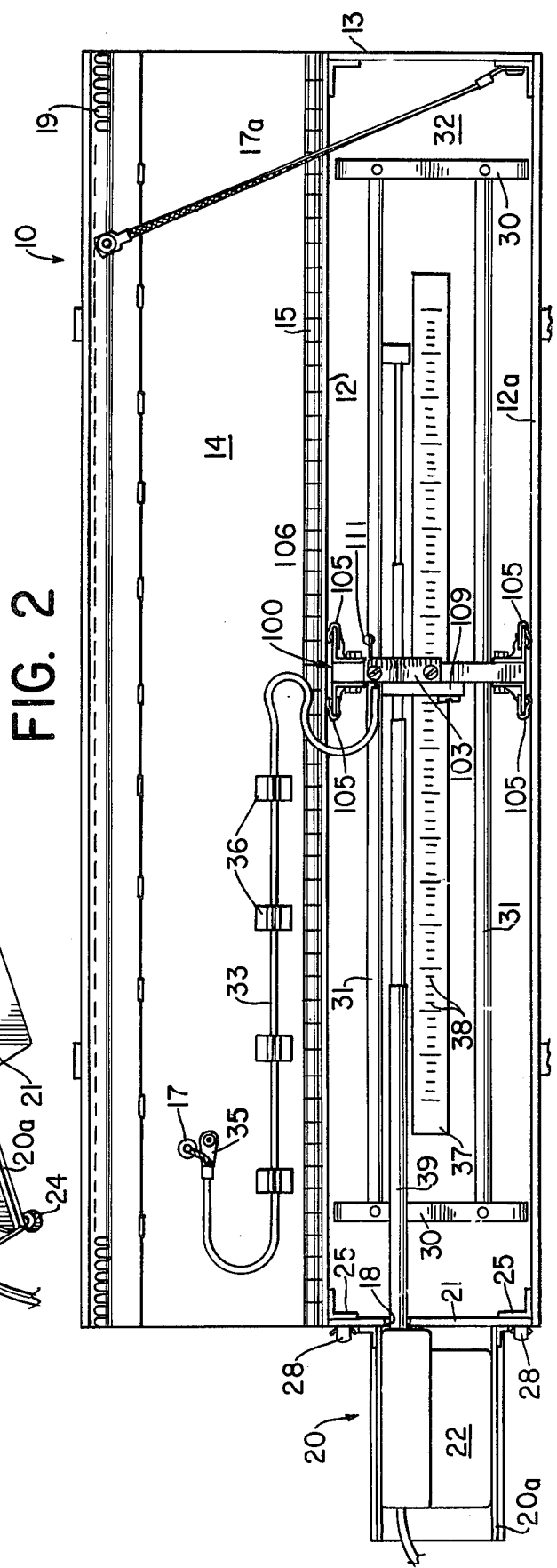

METHOD AND APPARATUS FOR TESTING SURVIVAL RADIOS

GENERAL DESCRIPTION

This application relates to radio test equipment and more particularly to a method and apparatus for testing emergency/survival radio transceivers and beacons in the field.

Portable emergency radios serve the crucial function of allowing victims of aircraft or boat accidents to transmit signals over assigned emergency frequencies to enable rescuers to locate them. It can be of particular importance for pilots of military aircraft to have the operation of their survival radio transmitters tested before each mission. Such testing requires test equipment which is suitable for use at front echelons and which is low in cost and complexity, easily operated by relatively untrained field personnel, and capable of verifying the operation of the equipment tested with a high degree of confidence.

Laboratory-type instruments for testing survival radios are usually not available in areas where such radios are deployed. Furthermore, the skills of typical field personnel are usually not sufficient for the operation of laboratory-type test instruments. Moreover, the testing of survival radios with such instruments usually need to be performed within screen rooms to prevent radio frequency interference from being generated on the assigned emergency channels during the testing operation. Such screen rooms are expensive to construct and are not typically available in the field.

Currently available test equipment which is suitable for field use suffers the disadvantage of not providing a complete test of the radio. For example, equipment exists for testing the RF power output where the antenna for the radio under test is replaced by a simulated antenna load. Unfortunately, such equipment does not test the operation of the antenna itself. Thus, a radio which is completely inoperable by reason of a faulty antenna could pass a test in which the antenna was replaced by a dummy load.

In accordance with the present invention, a survival radio test apparatus is provided which overcomes all of the above-discussed disadvantages. The apparatus is relatively inexpensive and simple to operate and simulates the actual operating conditions of the ratio under test.

The chief component of the apparatus is a metallic test chamber of novel design into which the rod-type antenna of the radio to be tested may be inserted. The chamber has dimensions such that it acts as a wave guide having a lower cutoff frequency well above the operating frequency of any of the radios to be tested. Such a waveguide will not support axial propagation of radio frequency energy having a frequency below the lower cutoff frequency. Thus, such radio frequency energy would not be radiated from the ends of the waveguide even if these ends were open. Because of the fact that one end of the test chamber of the present invention must have an aperture for allowing the antennas to be inserted into the chamber, the lower cutoff frequency characteristic of the chamber is important to ensure that substantially all of the radio frequency energy radiated by the antenna of the radio under test is absorbed within the chamber. Since survival-type radios operate at frequencies between 100 and 300 megaherx (MHz), an illustrative embodiment of the test chamber described herein is dimensioned to have a lower cutoff frequency of 600 MHz.

The interior of the chamber is provided with a movable load carriage which may be positioned to connect a resistive load to any desired position of the antenna. A calibration procedure, described herein, determines, for each type or model of radio to be tested, the position at which the load carriage should be placed in order that the energy absorbed by the resistive load shall equal the energy which would have been radiated by the antenna of the particular radio type being tested had that radio been positioned "free space". The test chamber also includes means for connecting the resistive load to a power meter which is calibrated to a particular reading (e.g. center scale) for the minimum acceptable power output of the particular type of radio being tested.

To test a particular type of survival radio, the load carriage is moved to the predetermined position corresponding to that radio type. The antenna of the radio is appropriately positioned within the test chamber and the lid of the test chamber is closed. Upon activation of the radio transmitter power meter will read center scale if the radio is operating properly. Any reading substantially below center scale reading indicates that the radio (or the antenna thereof) is defective. A reading above center scale indicates that the performance of the radio exceeds minimum specifications.

It is an object of the present invention, therefore, to provide a survival radio test apparatus which is portable, simple in construction, and requires little technical skill to operate.

It is a further object of the invention that the apparatus be adapted to test many types of existing survival radios and be easily adapted to test radios of new design.

It is a still further object of the present invention that the test apparatus be capable of verifying the operation of both the radio under test and the antenna thereof by simulating actual operating conditions.

It is yet a further object of the invention that the testing of the radio not result in significant radiation which may create radio frequency interference with other radio facilities.

It is yet a further object of the invention that calibration of the test apparatus be relatively easy to perform.

DETAILED DESCRIPTION

This invention is pointed out with particularity in the appended claims. An understanding of the above and further objects and advantages of this invention may be obtained by referring to the following description in conjunction with the following drawings wherein:

FIG. 1 is a perspective view of the test chamber of the present invention with the antenna of a radio to be tested inserted therein;

FIG. 2 is a top view of the test device with the test chamber cover opened to show the internal components of the chamber;

TEST CHAMBER STRUCTURE

FIG. 1 is a generally pictorial view of the test chamber 10 of the present invention. Basically, the test chamber 10 is a metallic box which acts as a wave guide. Such a wave guide exhibits the properties of a high-pass filter having a lower cutoff frequency which is determined by the dimensions of the waveguide. In the preferred embodiment illustrated by FIG. 1, test chamber 10 has nominal dimensions of $30'' \times 5'' \times 3\frac{1}{2}''$. These dimensions result in a lower cutoff frequency of 600 MHz. With these dimensions, the test chamber 10 will not support the propagation of RF wave energy travelling along its longitudinal axis below 600 MHz. Radiation of such energy from the ends of the chamber 10 is thereby prevented even if an end of the chamber has an aperture such as the aperture 18 described below. The survival radios for which the present apparatus is intended operate at frequencies between 100 and 300 MHz. Thus radio transmissions within the test chamber 10 in the 100–300 MHz frequency range are substantially contained within the chamber. This feature of the invention prevents undesirable radiation of RF interference on the assigned emergency channels which must be kept clear for actual emergency transmissions.

Figure 3:
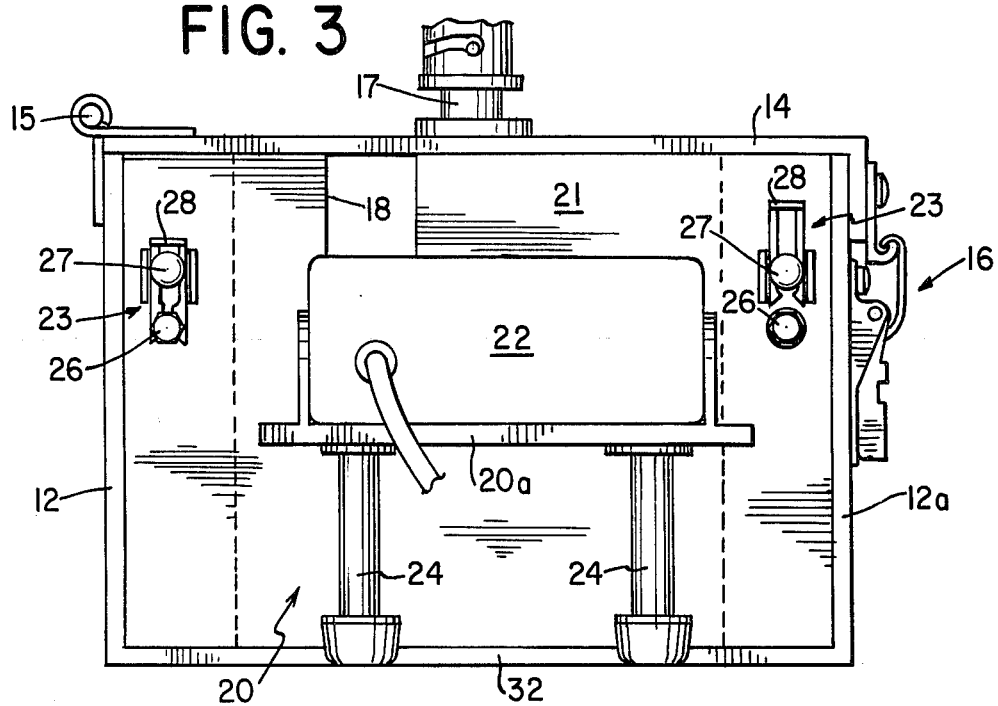
FIG. 3 is an end elevation of the test device of FIG. 1.

Referring to FIGS. 1, 2 and 3, test chamber 10 includes a pair of side walls 12 and 12a, and end wall 13 and a bottom 32. A top cover 14 is attached to the side wall 12 by a hinge 15. The top cover 14 may be secured to the other side wall 12a by means of one or more conventional latches 16. A power output terminal 17, which is adapted preferably to accept a conventional BNC-type cable connector, is mounted on the top cover 14. The test chamber 10 is completed by a cradle assembly 20 which is removably secured outside the end of the chamber 10 opposite end wall 13.

Cradle assembly 20 comprises a cradle 20a which is supported by one or more legs 24 and connected to a butt plate 21. Butt plate 21 has an aperture 18 through which the antenna 39 of a radio 22 to be tested may be inserted into the test chamber 10. Preferably, a plurality of cradle assemblies 20 are provided, each one of which is dimensioned to support a corresponding radio type. The butt plate 21 of each of these cradle assemblies should be identical, however, so that the antenna 39 will always be guided into the same position in the test chamber 10 irrespective of the radio type being tested and of the position of the antenna 39 relative to the body of the radio in each such radio type.

In the presently preferred embodiment of the invention, butt plate 21 includes a pair of holes 29. A snap slide fastener assembly 23 comprising a clip 28 slidably mounted on a stud 27 which is mounted on the butt plate 21 is positioned adjacent each of the holes 29. A pair of angle flanges 25 are affixed to corresponding side walls 12 and 12a of the test chamber 10 at the end of the chamber to which cradle assembly 20 is to be secured. Each of the flanges 25 includes an outwardly protruding guide pin 26 which is dimensioned to be received by the corresponding hole 29 in the butt plate 21 thereby guiding the butt plate 21 into the proper position. With the butt plate thus in position each clip 28 is slid downward to engage its corresponding guide pin 26, thereby removably securing the butt plate 21 and cradle assembly 20 in place.

It will be appreciated that the means for securing cradle assembly 20 to the test chamber 10 just described is meant to be illustrative only, and numerous alternative means for removably securing the cradle assembly 20 to the test chamber 10 will be readily apparent to practitioners of the art.

Referring to FIG. 2, two guide rail supports 30 are mounted on the bottom 32 of the chamber 10. Two parallel guide rails 31 are mounted between the guide rail supports 30 and pass through corresponding holes 101 in the body 120 of a load carriage 100 shown in FIG. 4. Guide rail supports 30, guide rails 31 and the body 120 of the load carriage 100 are formed of non-conductive plastic material such as polystyrene.

Also mounted on the bottom 32 of the test chamber 10 is an indicia strip 37 which is also formed of a non-conductive material. The indicia strip 37 includes a plurality of equally spaced indicia marks 38 and, preferably, a numbered scale for the indicia marks (not shown).

Figure 4:
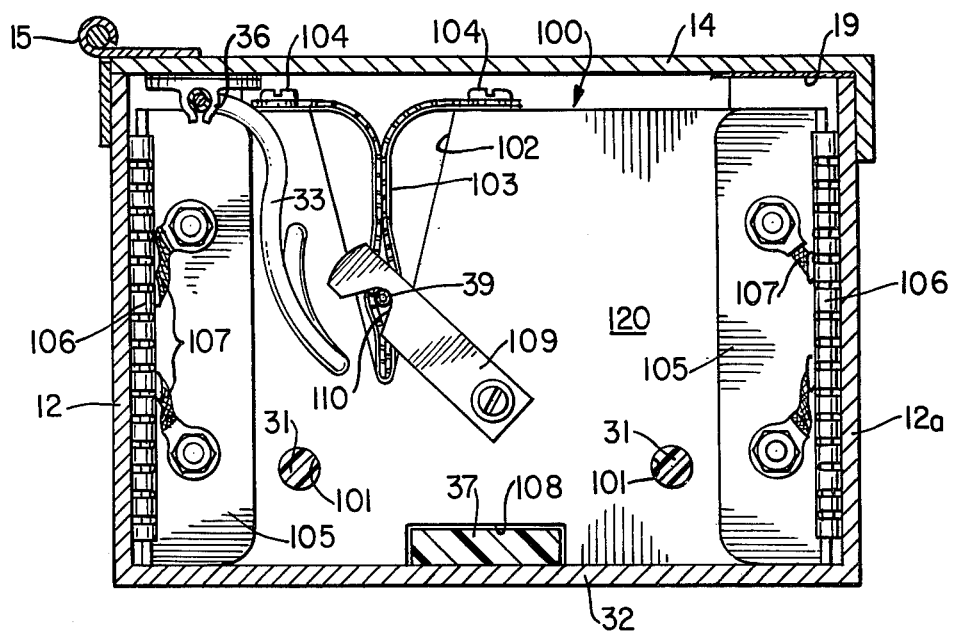
FIG. 4 is a sectional view of the test chamber of FIG. 1 taken along the line 4—4.
Figure 5:
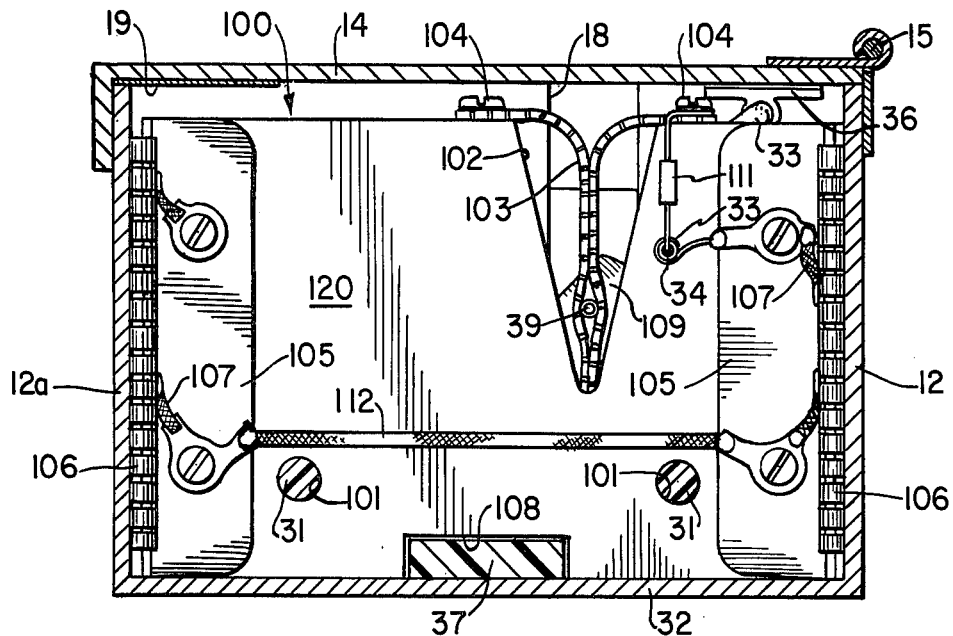
FIG. 5 is a sectional view of the test chamber of FIG. 1 taken along the line 5—5.

FIGS. 4 and 5 show further details of the load carriage 100. As previously noted, the body 120 of the load carriage 100 includes a pair of holes 101 through which the guide rails 31 pass. The body 120 of the load carriage 100 also has a cut-out 108 for accepting the indicia strip 37. The body 120 also includes a V-shaped notch 102 for receiving the antenna 39 of the radio 22 under test. A resilient metallic (e.g. beryllium-copper) spring contact strip 103 is affixed within the V-shaped notch 102, as by screws 104. A non-conductive latch 109 having a notch 110 is pivotably mounted on the body 120 alongside the V-shaped notch 102. A pair of metallic angled flanges 105 are mounted on the body 120 alongside each of its edges facing the side walls 12 and 12a of the test chamber 10. A resilient metallic spring contact strip 106 is formed over each of the outside edges of flanges 105 so that the spring portions of strips 106 maintain sliding electrical contact with the side walls 12 and 12a of the test chamber 10. Strips 106 are secured to the flanges 105 and maintained in electrical contact with it by means of ground straps 107. A ground strap 112 is also connected between the flanges 105 to ensure that equal (ground) potential is maintained at the side walls 12 and 12a of the test chamber 10.

A load resistor 111 is connected between the resilient strip 103 and one end of the center conductor 34 of a coaxial cable 33. The shield or outer conductor of cable 33 is connected to ground at one of the ground strap assemblies 107.

Referring again to FIG. 2, it will be noted that cable 33 is removably secured to the top cover 14 of the test chamber of plastic clips 36 leaving sufficient play in the cable to accommodate movement of the load carriage 100 over the length of chamber 10. The other end of center conductor 34 of cable 33 is connected to the center conductor of the power output terminal 17 in the top 14 of chamber 10 and the corresponding end of the cable shield is connected to the top cover 14 by a lug 35 so as to be in electrical contact therewith. A metallic spring contact strip 19 is soldered or otherwise electrically and physically connected to the inside surface of cover 14 opposite sidewall 12a so that when the cover 14 is closed, strip 19 makes electrical contact with side wall 12a.

A wire 17a is removably connected between cable 14 and the corner of the test chamber 10 defined by the intersection of end wall 13 and sidewall 12a to insure that cover 14 is not opened too far.

THEORY OF OPERATION

It is believed that a discussion of some of the theoretical principles underlying the present invention will be helpful in understanding the calibration procedure for the test chamber and the test procedure for survival radios utilizing the test chamber with are set forth below.

It is known that if RF energy is applied to the feed point of an antenna which is located in free space (i.e., removed from any electrically conductive obstacles by a substantial distance), a portion of this energy is absorbed by the antenna and radiated therefrom and the remainder of the energy is reflected back to the feed source. It is also known that the ratio between the amount of applied energy of the applied energy which is absorbed by the antenna to the amount which is reflected is related to the ratio between the magnitude of the resistive component of the antenna impedance to the magnitude of the reactive component of the impedance. Thus, proper opertion of a radio system may be determined by measuring the RF energy which is absorbed by the antenna. If the energy applied to the feed point of the antenna (forward power), and the energy reflected back from the feed point (reverse power) is measured, the power absorbed by the antenna may be determined by subtracting the magnitude of the reverse power from the magnitude of the forward power.

If a radio antenna such as the one discussed above is placed within the confines of a metal box its impedance will appear as almost a pure reactance (no resistive component) to RF energy applied at the feed point. An antenna so placed would, therefore, reflect back essentially all of the power applied to it. It has been found, however, that if the antenna is loaded somewhere along its length with a resistive load connected to ground, a portion of the energy applied at the feed point will be absorbed by the load and the remaining energy will be reflected back from the feed point. For a given value of resistive load, the ratio between the energy absorbed by the load and the energy reflected back from the feed point is determined by the position at which the load is connected to the antenna. Thus, by connecting a resistive load of known value to an appropriate point on the antenna, the reflection absorption characteristics of an antenna in free space can be simulated by an antenna enclosed in a metal box.

If the power absorbed by such an appropriately positioned load attached to the antenna of a radio under test is directly measured (e.g., by a wattmeter), this measured value is a direct indication of the power which would have been radiated by the antenna had it been positioned in free space. Such a method for measuring the RF power output of a radio under test serves to verify that both the electronic circuitry and the antenna of the radio under test are in proper working condition without requiring actual radiation of RF power of the antenna beyond the confines of the box. This consideration is of extreme importance in the testing of survival radios since the assigned emergency channels on which they operate must be kept free from any radio transmissions other than those which are initiated in actual emergency situations.

CALIBRATION PROCEDURE

Figure 6:
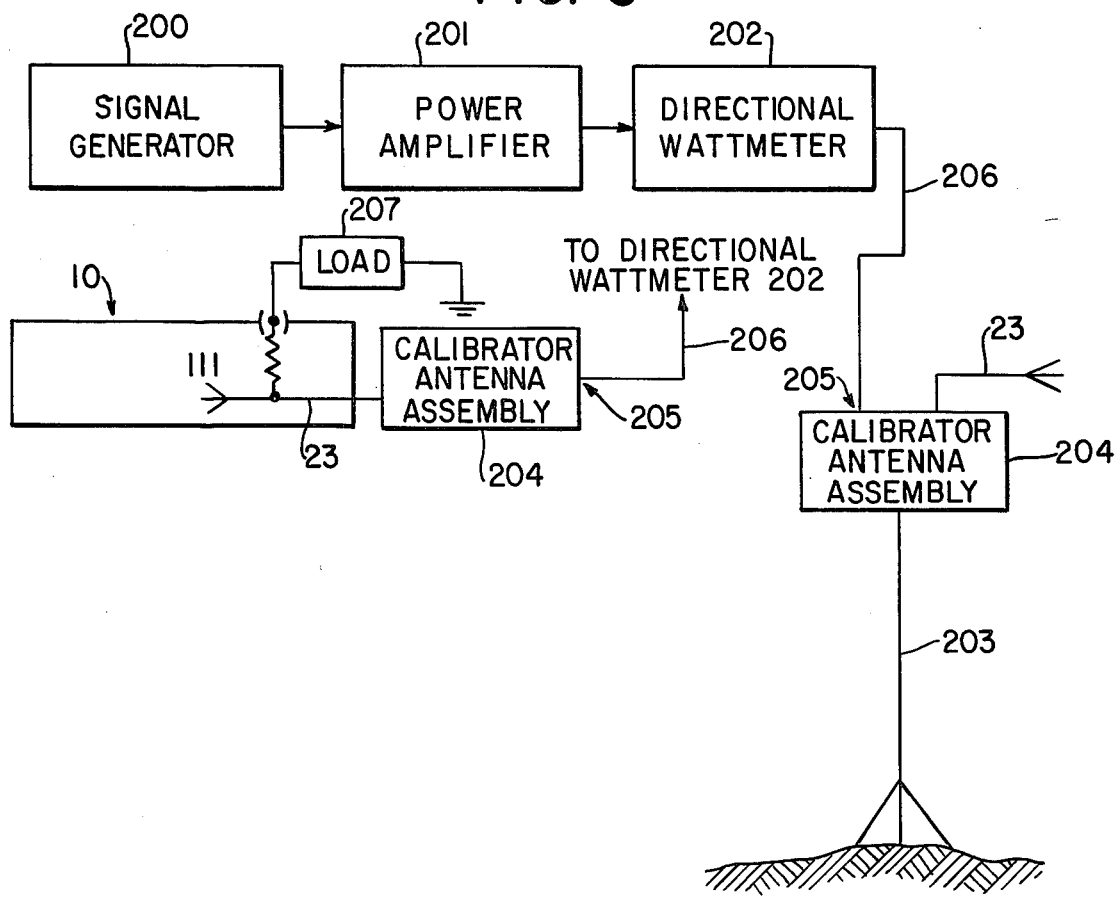
FIG. 6 is a block diagram illustrating the equipment utilized in calibrating the test chamber.

Utilizing the above-discussed principles, the test chamber is calibrated for each type of radio to be tested as follows. Reference to FIG. 6 will be helpful in understanding the following discussion.

Prior to beginning the calibration procedure, a calibration antenna assembly 204 is prepared. This calibration antenna assembly comprises an empty radio case and antenna simulating closely the radio type for which the calibration procedure is to be performed. The calibration antenna assembly 204 is placed on a wooden tripod or post at shoulder height in a relatively clear area (e.g., at least 100 feet from any significant electrically conductive obtructions). The feed point 205 of calibrator antenna assembly 204 is connected to the input terminal of a directional watt meter 202 (e.g., a Bird Wattmeter, Model 43, or equivalent) by means of a coaxial cable 206 having a length equal to one-half wavelength at the frequency at which the calibration is to be performed. For example, if the test chamber is to be calibrated for radios operating at 243 MHz coaxial cable 206 may be a length of RG 58/U coaxial cable 16 inches long. Utilization of such a cable causes the impedance of the antenna at its feed point 205 to appear at the point at which the cable 206 is connected to the directional wattmeter 202.

Wattmeter 202 is connected to a power amplifier 201 (such as a Boonton Model 230A or equivalent), which in turn is connected to a signal generator 200 (such as a Hewlett-Packard Model HP-608E or equivalent). Preferably, signal generator 200 is tuned to a frequency which is close to but not exactly equal to the assigned emergency frequency in question, to prevent radio frequency interference on the emergency channel. For example, if the calibration is to be performed for survival radios which operate on the 243 MHz emergency channel, signal generator 200 may be tuned to 241 MHz. It has been found that the errors resulting from performing the calibration procedure at frequencies so slightly removed from the actual emergency frequency are negligible provided that all calibration measurements are performed at the same frequency. However, where feasible, calibration should be done at exactly the frequency to be used.

The output level of signal generator 200 is now adjusted so as to obtain a predetermined forward power reading (e.g., 200 milliwatts) on the directional wattmeter 202. The directional wattmeter 202 is then reversed and the value of the reverse power at antenna feed point 205 is recorded.

Next the calibrator antenna assembly 204 is removed from tripod 203 and installed within the test chamber 10. To do so, the test chamber assembly 10 is first placed in a horizontal position with the latches 16 facing the operator, with the top cover 14 open. A cradle assembly 20 corresponding to the radio type for which the calibration is to be performed is selected and secured to the remainder test chamber assembly with clips 28. The calibration antenna assembly 204 is then placed on the cradle 20 with its antenna 39 extending through the aperture 18 in butt plate 21. The antenna 39 is extended full length and pushed into the V-shaped slot 102 of load carriage 100 so as to engage and make electrical contact with the resilient strip 103. The antenna 39 is then secured in place by pivoting the latch 109 so that the end of its notch 110 engages the antenna 23. Top cover 14 is then closed and latched and the test chamber is ready to be utilized in the calibration procedure.

The power output terminal 17 of the test chamber should have a load 207 connected to it which duplicates the input impedance of the indicating instrument to be connected to terminal 17 during testing. Preferably load 207 is provided by allowing this indicating instrument 210, 212 (FIG. 7) to remain connected to power output terminal 17 during the calibration procedure.

Forward and reverse power readings are then again recorded from the directional wattmeter 202. Assuming that these readings are not identical to the readings previously obtained when calibrator antenna assembly 204 was in free space, the load carriage 200 is then repositioned so that its load resistor 111 is connected to a different position of the antenna. This procedure is repeated until a position of the load carriage 200 is found at which the forward and reverse power readings of the directional wattmeter 202 are identical to the readings obtained when the calibrator antenna assembly 204 was in free space. This position of the load carriage 200 is then either recorded directly on the indicia strip 37 for the radio type involved or, alternatively, the numerical value of the indicia mark 38 at the position of the load carriage is recorded in a table. The table may be taped to the inside of the top cover 14 of the test chamber so as to be available to the operator of the test apparatus during subsequent testing operations for any of the radio types to be tested.

The described calibration procedure is repeated for each type of radio to be tested, utilizing appropriately prepared calibration antenna assemblies 204. The procedure is also repeated for each frequency at which a particular type of radio may be equipped to operate, utilizing a cable 206 which is cut to the appropriate length for each such frequency.

TESTING PROCEDURES

Figure 7:
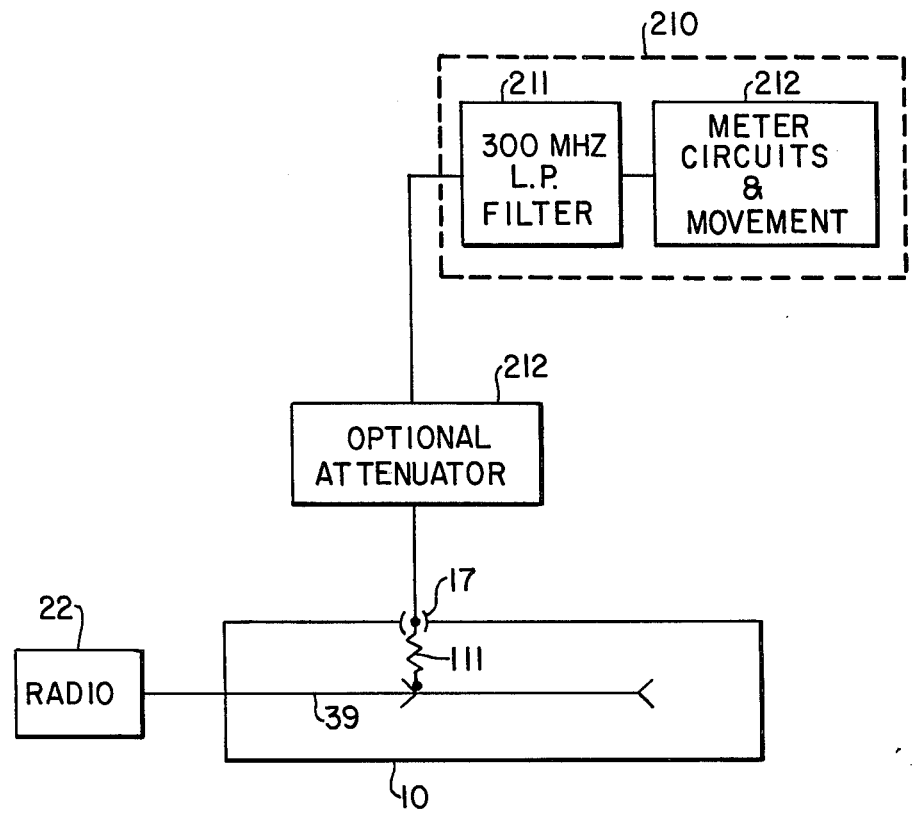
FIG. 7 is a block diagram illustrating the test equipment set-up for testing survival type radios in accordance with the invention.

FIG. 7 illustrates the apparatus of the present invention set up for testing survival radios. An output meter 210 preferably having the characteristics set forth below is connected to the power output terminal 17 of the test chamber 10, either directly or through an optional attenuator 212.

It has been found that as a result of the calibration procedure described above, the load resistor 111 will be positioned at a point along the length of the antenna 39 at which the impedance of the antenna 39 equals that of the load applied to it at that point. With the load resistor 11 so positioned, the feed point of the antenna 39 assumes the impedance of the feed point in free space and the voltage/current distribution on the antenna 39 within the confines of the test chamber 10 simulates the voltage/current distribution of the antenna 39 in free space.

The inpedance of an antenna of typical survival radio transmitter varies between 73 and 350 ohms along its length. The impedance of the load applied to such an antenna should, therefore, be selected to fall within this range.

In a preferred embodiment of the invention the load impedance has been chosen to be 123 ohms. This load includes a 73 ohm load resistor 111 which is mounted on the load carriage 100 and connected between the strip 103 and the center conductor 34 of coaxial cable 33. The remaining 50 ohms of the load is supplied by the input impedance of the output meter 210 and the characteristic impedance of the optional attenuator 212. This selection of the value of the load resistor 111 above makes possible the use of a wide variety of commercially available output meters having input impedances of 50 ohms and RF attenuators having characteristic impedances of 50 ohms.

A further desirable characteristic for the output meter 210 utilized in conjunction with the present invention is the inclusion in it of a low-pass filter 212 which rolls off its response beginning at 300 MHz. It will be noted that typical survival radio transmitter radios having a nominal operating frequency of 243 MHz may actually radiate energy having a high harmonic content at 486 MHz. If the total radio frequency energy emitted by the antenna of such a radio is measured without first eliminating the energy emitted at the harmonic frequency, an output power reading may be obtained which indicates that the power output of the radio is acceptable, when in fact only a portion of the total power output is being radiated at the correct operating frequency. The inclusion of the 300 MHz filter 211 prior to the meter circit and movement stage 212 of the output meter 210 insures that only radio frequency energy radiated at the correct operating frequency of the radio under test will be taken into account in determining whether the power output of that radio is acceptable. It is preferable that the output meter 210 and optional attenuator 212 to be used during the testing of each radio type should be connected to the power output terminal 17 as illustrated by FIG. 7. During the calibration procedure the output meter 210 should be calibrated to read center-scale for correct operation of the lowest-powered radio type to be tested. For example, an AN/PRC-90 radio has a specification of 100 milliwatts average power output per channel. The RT-10 radio, on the other hand, has an output power specification of 200 milliwatts. If both of these radio types are to be tested, the output power meter should be calibrated to read 100 milliwatts center-scale without an attenuator inserted between the output terminal and the meter. During the calibration procedure and testing of the 200 milliwatt RT-10 radio, a 3 db 50-ohm attenuator is inserted between the input terminal of the meter 210 and the power output terminal 17, thereby effectively calibrating the meter to read center-scale at 200 milliwatts. For other output power values, corresponding attenuation is included to provide center reading at rated power.

OUTPUT POWER TESTING

Testing of the power output of a survival type radio utilizing an appropriately calibrated test chamber 10 of the present invention is performed as follows.

The load carriage 100 of the test chamber is first moved to the position which has been determined during the calibration procedure to be appropriate for the radio type being tested. A cradle assembly 20 corresponding to the radio type under test is then assembled with the test chamber 10 and secured thereto with the slide latches 23. The radio 22 to be tested (with fresh batteries) is then placed on the adaptor cradle with its antenna 39 extending through the aperture 18. The antenna 39 is extended full length so as to be received by the notch 102 in the load carriage 100 so as to make electrical contact with the resilient strip 103. The latch 109 is then pivoted over the antenna 39 so as to secure the antenna 39 within the V-notch 102 of the load carriage. The top cover 14 of the test chamber is then closed and secured, and the output meter 210 and appropriate attenuator 212 (if any) are connected to the output terminal 17. The radio 22 is then activated and its relative output power read from the output meter 210. If the output meter shows that the RF output of the radio is substantially below center scale the radio is defective.

RECEIVER TESTING

Although the test chamber 10 of the present invention has heretofore been discussed only in relation to its utilization in performing tests upon radio transmitters, it may also be used to perform field tests upon radio receivers.

If the antenna of a radio transmitter is installed in the test chamber, and the load carriage of the chamber is positioned at the appropriate location for that transmitter, it has been found that the magnitude of the radio frequency energy which will escape from the chamber will be 35 DBM below the magnitude of the radio frequency energy dissipated by the antenna within the chamber. Thus, a transmitter dissipating 200 milliwatts within the chamber is analogous to a transmitter dissipating 0.05 milliwatts in free space. Under such conditions the signal level is quite low within a short distance from the shielded transmitter and undesirable radiation of RFI on assigned emergency frequencies is minimized. Moreover, a receiver responding to a test transmitter within the chamber at a location of 150 feet from the chamber or more may be regarded as a serviceable receiver. This may be used as a test for operation of receivers intended to operate with the survival radio.

Although specific embodiments of the invention have been disclosed for illustrative purposes, it will be appreciated by those skilled in the art that many additions, modifications and substitutions are possible without departing from the scope and spirit of the invention as defined in the accompanying claims.

What is claimed is:

1. Test apparatus for checking the radio frequency power emitted by a radio transmitter having a rod antenna comprising:
   an elongated metallic box forming an interior compartment adapted for screening radio frequency energy from exiting or entering said compartment, said compartment being adapted to receive said antenna inside said compartment;
   an output terminal mounted to an outside surface of said box;
   a resisitive impedance movably mounted in said compartment and having a first terminal connected to said output terminal and a second terminal adapted to make slidable contact with said antenna; and
   means for indicating the point of contact of said second terminal with said antenna.

2. Apparatus in accordance with claim 1 including means at one end of said box for supporting a transmitter under test, said supporting means comprising a cradle assembly adapted for supporting a particular radio type, said cradle assembly including
   a cradle adapted to support the radio;
   a butt plate connected to said cradle and adapted to be secured to said box to form one end wall thereof and having an aperture positioned for receiving said antenna into a predetermined position of said compartment at which a predetermined distance is maintained between said antenna and each of the walls of said compartment.

3. Apparatus in accordance with claim 1 wherein said resistive impedance is fixedly mounted to a non-metallic load carriage which is slidably mounted for longitudinal movement thereof within said compartment,
   said load carriage having an opening for receiving said antenna and including a metallic strip mounted in said opening and connected to said second terminal for making slidable electrical contact with said antenna.

4. Apparatus in accordance with claim 1 further comprising:
   a power output meter connected to said output terminal for indicating the amount of radio frequency power absorbed by said resistive impedance.

5. Apparatus in accordance with claim 4 wherein said meter includes a low-pass filter for rejecting radio frequency energy having a frequency above a predetermined frequency.

6. Apparatus in accordance with claim 5 wherein said predetermined frequency is substantially 300 MHz.

7. Apparatus in accordance with claim 1 wherein said metallic box is dimensioned to act as a waveguide having a cut-off frequency substantially greater than the operating frequency of said radio transmitter.

8. A method for calibrating a test apparatus for testing the operation of each one of a plurality of radio types by use of a calibrator antenna comprising an empty case of the radio type for which the calibration is to be performed secured to a corresponding antenna said antenna being adapted to radiate power into free space, said method comprising the steps of:
   applying a predetermined magnitude of forward power to the calibrator antenna at a frequency corresponding to an operating frequency of the radio type for which the calibration is being performed;
   radiating power into free space;
   measuring the magnitude of reverse power reflected back from said calibrator antenna;
   positioning said calibrator antenna in test apparatus adapted to absorb power from said antenna;
   applying said predetermined magnitude of forward power to said calibrator antenna at said corresponding frequency;
   comparing the magnitude of reverse power reflected back from the calibrator antenna with the magnitude of reverse power obtained in said measuring step;
   positioning a resistive impedance at a position along said antenna where the relation between forward and reverse power is the same as was measured during free space radiation; and
   indicating said position of said resistive impedance to determine a calibration point for said radio type.

9. The method of claim 8 wherein said corresponding frequency is a frequency substantially but not exactly equal to the operating frequency of the radio type for which the calibration is being performed.

10. A method of checking the radio-frequency power emitted by each of a plurality of types of radio transmitters having rod antennas, said method employing a test apparatus adapted to receive energy from said antenna and to substantially prevent any radio frequency radiation from exiting from said apparatus and including a movable energy-absorbing load adapted to make contact with various points of said antenna, said apparatus being precalibrated to indicate, for each of said transmitter types, a predetermined position of said load at which said load absorbs an amount of energy equal to the energy radiated by said antenna in free space, said method comprising the steps of:

moving said load to the one of said predetermined positions which corresponds to the transmitter type to be checked;

activating said radio transmitter, and measuring the amount of radio frequency energy absorbed by said load.

11. A method of checking the radio-frequency power emitted by a radio transmitter having a rod antenna, said method employing a test apparatus adapted to receive energy from said antenna and to substantially prevent any radio frequency radiation from exiting from said apparatus and including a movable energy absorbing load adapted to make contact with various points of said antenna, said method comprising the steps of:

measuring the normal power radiated by said antenna in free space;

determining the point along said antenna at which said load would absorb an amount of power equal to said normal power;

installing said antenna in the test apparatus;

moving said load to the point of said antenna which was determined in said determining step;

activating said radio transmitter; and measuring the amount of radio frequency energy absorbed by said load.

12. The method of claim 11 further comprising the step of:

comparing the measured amount of radio frequency energy absorbed by said load with a predetermined magnitude of minimum acceptable output power for said radio transmitter.

13. The method of claim 12 further comprising the step of:

producing a first indication if said comparing step indicates that said measured amount of radio frequency energy absorbed by said load is equal to or greater than said predetermined magnitude of minimum acceptable output power.

14. The method of claim 12 further comprising the step of:

producing a second indication if said comparing step indicates that said measured amount of radio frequency energy absorbed by said load is less than said predetermined magnitude of minimum acceptable output power.

15. The method of claim 10 wherein said measuring step comprises the steps of:

separating the radio frequency energy absorbed by said load into a first component comprising energy at the nominal operating frequency of said transmitter and a second component comprising energy at frequencies other than the nominal operating frequency of said transmitter; and measuring the amount of radio frequency energy of said first component.

* * * * *